United States Patent
Liu et al.

(10) Patent No.: US 11,542,910 B2
(45) Date of Patent: Jan. 3, 2023

(54) MULTIPLE WEIGHT PENDULUM-BASED WAVE ENERGY HARVESTING APPARATUS INCORPORATING MAGNETIC REPULSION-BASED PIEZOELECTRIC POWER GENERATION MECHANISM

(71) Applicant: SOOCHOW UNIVERSITY, Suzhou (CN)

(72) Inventors: Huicong Liu, Suzhou (CN); Tao Chen, Suzhou (CN); Lining Sun, Suzhou (CN)

(73) Assignee: SOOCHOW UNIVERSITY, Suzhou (CN)

(*) Notice: Subject to any disclaimer, the term of this patent is extended or adjusted under 35 U.S.C. 154(b) by 112 days.

(21) Appl. No.: 17/286,008

(22) PCT Filed: Aug. 7, 2020

(86) PCT No.: PCT/CN2020/107717
§ 371 (c)(1),
(2) Date: Apr. 16, 2021

(87) PCT Pub. No.: WO2021/077854
PCT Pub. Date: Apr. 29, 2021

(65) Prior Publication Data
US 2021/0399610 A1 Dec. 23, 2021

(30) Foreign Application Priority Data
Oct. 24, 2019 (CN) .......................... 201911017952.3

(51) Int. Cl.
*F03B 13/16* (2006.01)
*H02K 7/18* (2006.01)

(52) U.S. Cl.
CPC ........... *F03B 13/16* (2013.01); *H02K 7/1853* (2013.01)

(58) Field of Classification Search
CPC .......... F03B 13/16; F03B 13/20; F03B 13/14; F05B 2250/44; F05B 2250/72;
(Continued)

(56) References Cited

U.S. PATENT DOCUMENTS 3,231,749 A * 1/1966 Hinck, III ............ H02K 7/1853
415/7
4,110,630 A * 8/1978 Hendel .................. H02K 35/02
310/11
(Continued)

FOREIGN PATENT DOCUMENTS

CN 107218171 A 9/2017
CN 206770100 U 12/2017
(Continued)

*Primary Examiner* — Tulsidas C Patel
*Assistant Examiner* — S. Mikailoff
(74) *Attorney, Agent, or Firm* — SZDC Law P.C.

(57) ABSTRACT

The invention provides a compound-pendulum up-conversion wave energy harvesting apparatus, comprising a shell floating on the water surface and swinging with fluctuation of waves, a compound-pendulum mechanism rotatably arranged in the shell and rotating with its swinging, a driving gear rotatably arranged in the shell and rotating synchronously with the compound-pendulum mechanism, an electromagnetic power generation mechanism arranged in the shell and configured to be meshed with the driving gear for transmission to generate electricity through electromagnetic induction, and a piezoelectric power generation mechanism arranged in the shell and configured to be deformed during its rotation to generate electricity through piezoelectric effect. When the shell swings un-directionally with fluctuation of the waves, the compound-pendulum mechanism makes un-directional rotation that adapts to the dynamic changes of water surface wave energy. The electromagnetic power generation mechanism and the piezoelectric power (Continued)

generation mechanism convert energy through two different electromechanical coupling transduction mechanisms.

8 Claims, 3 Drawing Sheets

(58) Field of Classification Search
CPC ........ F05B 2260/4031; F05B 2260/407; F05B 2220/706; H02K 7/1853; H02K 5/15; H02K 5/1735; H02K 1/2793; H02K 7/116; H02K 7/1846; H01L 41/1136; H02N 2/18; H02N 2/186; Y02E 10/30
See application file for complete search history.

(56) References Cited

U.S. PATENT DOCUMENTS

| | | | |
|---|---|---|---|
| 10,054,104 B1 * | 8/2018 | Cote | ................... B64D 45/00 |
| 10,060,407 B2 * | 8/2018 | Elefant | ................. F03B 13/20 |
| 10,920,739 B2 * | 2/2021 | Nematollahi Saein | ..................... F03B 13/14 |
| 2010/0025999 A1 | 2/2010 | Kim et al. | |
| 2020/0347817 A1 * | 11/2020 | Lee | ..................... H02K 5/10 |

FOREIGN PATENT DOCUMENTS

| | | | | |
|---|---|---|---|---|
| CN | 211082122 U | | 7/2020 | |
| GB | 297720 A | * | 9/1928 | |
| GB | 2490184 A | * | 10/2012 | ............ B63B 39/00 |
| JP | 2008309143 A | | 12/2008 | |
| WO | 2015086033 A1 | | 6/2015 | |

* cited by examiner

MULTIPLE WEIGHT PENDULUM-BASED WAVE ENERGY HARVESTING APPARATUS INCORPORATING MAGNETIC REPULSION-BASED PIEZOELECTRIC POWER GENERATION MECHANISM

This application is the National Stage Application of PCT/CN2020/107717, filed on Aug. 7, 2020, which claims priority to Chinese Patent Application No. 201911017952.3, filed on Oct. 24, 2019, which is incorporated by reference for all purposes as if fully set forth herein.

FIELD OF THE INVENTION

The present invention relates to the technical field of power generation, and more particularly to a compound-pendulum up-conversion wave energy harvesting apparatus.

DESCRIPTION OF THE RELATED ART

At present, in marine environment observation, fixed platform observation and mobile stereo-net observation are performed by various marine observation devices and systems, such as general-purpose and special-purpose ocean data buoys, Lagrange drifting buoys, equipped with multi-parametric sensors. These marine observation devices are in long-term motorized operation and carry various sensors, and thus produce numerous data while consuming a great amount of energy. Reliance merely on having a large capacity battery and reducing energy consumption is far from being sufficient. When necessary, energy has to be acquired from the marine environment or fed back from the system to guarantee long-term operation of the system.

About 71% of the surface area of the earth is covered by the ocean which contains an enormous amount of renewable energy, such as tidal energy, wave energy, ocean current energy, temperature difference energy, offshore solar energy and wind energy. Among them, ocean wave energy refers to the kinetic energy and potential energy of ocean surface waves. It is not affected by natural conditions such as temperature, weather, time of the day, season, and has the advantages of high energy density and wide distribution etc. It is an inexhaustible all-weather renewable clean energy that is easy to be directly exploited, and it is also the most direct energy available to marine equipment. It is estimated that the annual reserve of wave energy in global seas is $0.1 \times 10^{10}$ to $1.0 \times 10^{10}$ kW, and the average energy transmitted per meter of wave peak can be up to 10-50 kW. If marine wave energy resources are captured, converted and stored to provide energy for marine equipment, its endurance and independent survival ability will be greatly improved, and long-term, large-scale and unattended operation of marine observation equipment can be achieved, which is of great significance to improvement in human scientific observation, development and exploitation of marine resources and environment.

At present, the development and exploitation of wave energy are mainly focused on large-scale wave energy power generation apparatus of kilowatt and megawatt level. The common large-scale wave energy capturing means includes suspension pendulum, buoyancy pendulum, wave crossing, oscillating water column, oscillating floating body and nodding duck means, and the like. The wave energy harvesting apparatus is mainly composed of an energy capture mechanism (for absorbing wave energy) and an electromechanical coupling transduction mechanism. Its essence is to use the energy capture mechanism to absorb the ultra-low frequency multi-directional random vibration energy of ocean waves and drive the electromechanical coupling transduction mechanism in the form of relative linear motion, relative swinging or relative rotation to convert kinetic energy into electric energy. The energy capture mechanism usually uses an inertial slider, an inertial ball or an inertial pendulum to slide, roll or rotate relatively under the action of waves, so as to realize non-resonant or non-linear energy capturing. However, existing inertial energy capture mechanisms are generally inefficient in operation at extremely low ocean wave frequency.

Three commonly used electromechanical coupling transduction mechanisms include piezoelectric, electromagnetic and nano-friction mechanisms. The electromagnetic transduction mechanism converts the relative linear motion or relative rotation of the magnet and coil into electric energy based on the electromagnetic induction principle. The nano-friction energy conversion mechanism is based on electrostatic induction and triboelectric coupling effect, and usually adopts multi-layer stacking to improve energy conversion efficiency. The piezoelectric transduction mechanism generates electric energy output based on piezoelectric effect when the piezoelectric material is mechanically deformed. It has advantages of small size and high output power density, etc., and has strengths in high-frequency transduction, but it has low energy harvesting efficiency in low-frequency environments.

At present, few researches are made on miniature wave energy harvesting apparatuses for power supply to small marine observation equipment. Existing miniature wave energy harvesting apparatuses have the common key problems of low energy conversion efficiency and low output power density and can barely supply power to the sensor load or battery of marine observation equipment for a long time. In order to capture wave energy efficiently, the operation frequency of the energy capture mechanism should be matched with the ultra-low frequency vibration of ocean wave environment (generally less than 1 Hz), and at the same time, it should have a wide operation frequency band and multi-directional operation mode to adapt to the random changes in ocean wave frequency and direction. However, existing inertial energy capture mechanisms generally have low energy harvesting efficiency and low output power density in operation at very low frequency. In addition, existing miniature wave energy harvesting apparatuses adopt a single electromechanical coupling transduction mechanism, and use merely one of electromagnetic conversion, piezoelectric conversion and friction power generation, which have weak adaptability to ocean wave energy and low energy conversion efficiency.

Therefore, it is a technical problem faced by those skilled in the art to improve the wave energy capture efficiency and electromechanical energy conversion efficiency.

SUMMARY OF THE INVENTION

It is an object of the present invention to provide a compound-pendulum up-conversion wave energy harvesting apparatus that can improve the wave energy capture efficiency and the electromechanical energy conversion efficiency.

In order to solve the technical problems mentioned above, the present invention provides a compound-pendulum up-conversion wave energy harvesting apparatus, including a shell floating on the water surface and swinging with fluctuation of waves, a compound-pendulum mechanism rotatably arranged in the shell and rotating with swinging of the shell, a driving gear rotatably arranged in the shell and rotating synchronously with the compound-pendulum mechanism, an electromagnetic power generation mechanism arranged in the shell and configured to be meshed with the driving gear for transmission and driven by the driving gear to generate electricity through electromagnetic induction, and a piezoelectric power generation mechanism arranged in the shell above an end face of the driving gear and configured to be deformed during its rotation to generate electricity through piezoelectric effect.

Preferably, the compound-pendulum mechanism includes a support shaft vertically arranged on a bottom face of the shell, and a plurality of swing blocks circumferentially rotatably connected to a side face of the support shaft. The inner circular surface of the driving gear is connected to the outer end face of each swing block.

Preferably, the compound-pendulum mechanism further includes a bearing sleeved on the support shaft, a rotating disk mounted on the outer circular surface of the bearing, and a plurality of rotating beams connected to the outer circular surface of the rotating disk and distributed in the circumferential direction. The swing blocks are respectively mounted on the rotating beams, and the end of the rotating beams is connected to the inner circular surface of the driving gear.

Preferably, the swing blocks are each axially slidably arranged on a corresponding rotating beam, and a plurality of clamping grooves are axially opened on each rotating beam, each of the clamping grooves is configured for mounting a baffle for securing the swing block at the current position.

Preferably, the swing blocks are each a sector block, a conical block, a spherical block or a square block, and the masses of the swing blocks are different from each other.

Preferably, the electromagnetic power generation mechanism includes a plurality of driven gears rotatably arranged in the shell and meshed with the driving gear for transmission, and a plurality of rotor generators mounted in the shell and connected to the rotating shafts of the driven gears for generating electricity through rotation.

Preferably, the driven gears are distributed uniformly in the circumferential direction of the driving gear, and the transmission ratio between the driving gear and each driven gear is an acceleration ratio.

Preferably, a plurality of mounting grooves are opened on the inner wall of the shell for mounting the rotor generators and the driven gears.

Preferably, the piezoelectric power generation mechanism includes a plurality of piezoelectric power generation beams that are vertically swingably connected to the circumferential side face of the support shaft and configured to generate electricity through swinging and deformation, and a force transmission assembly configured to drive the piezoelectric power generation beams to vertically swing during rotation of the driving gear.

Preferably, the force transmission assembly includes a plurality of excitation magnets arranged on the end face of the driving gear in the circumferential direction and a plurality of response magnets arranged on the ends of the piezoelectric power generation beams and facing directly the excitation magnets, and a repulsive force is maintained between the excitation magnet and the response magnet.

The compound-pendulum up-conversion wave energy harvesting apparatus of the invention mainly includes a shell, a compound-pendulum mechanism, a driving gear, an electromagnetic power generation mechanism and a piezoelectric power generation mechanism. The shell is the main structure of the apparatus and is used mainly for mounting and bearing other parts. When in use, the shell floats on the water surface and swings un-directionally with fluctuation of waves on the water surface. The compound-pendulum mechanism is arranged in the shell and can freely rotate in the shell. When the shell swings, the compound-pendulum mechanism will be driven to rotate or swing. The driving gear is arranged in the shell and rotates synchronously with the compound-pendulum mechanism, or it can be considered that the compound-pendulum mechanism drives the driving gear to rotate. The electromagnetic power generation mechanism is arranged in the shell and is mainly configured to be meshed with the driving gear for transmission, so as to generate electricity through rotation by using the electromagnetic induction principle under the driving of the driving gear 3. The piezoelectric power generation mechanism is arranged in the shell and specifically above the end face of the driving gear, and is mainly configured to be elastically deformed during rotation of the driving gear through the interaction force therebetween, while generating electricity by using the electric energy generated through the piezoelectric effect of the piezoelectric material. In this way, when the shell swings un-directionally with fluctuation of the waves on the water surface, the compound-pendulum mechanism in the shell generates deflection torque under the influence of gravity, inertia and other factors, and then makes non-directional rotation accordingly. The rotation state parameters (such as steering, angular velocity, etc.) of the compound-pendulum mechanism are closely related to the characteristics of water surface wave energy, such as frequency, direction, amplitude. Therefore, the rotating motion of the compound-pendulum mechanism can adapt well to the dynamic changes of water surface wave energy, providing high energy capture efficiency. Meanwhile, once the compound-pendulum mechanism drives the driving gear to rotate synchronously, the electromagnetic power generation mechanism and the piezoelectric power generation mechanism can simultaneously convert their mechanical energy through two different electromechanical coupling transduction mechanisms, providing wide coverage of wave energy spectrums, good adaptability and high energy conversion efficiency.

BRIEF DESCRIPTION OF THE DRAWINGS

In order to explain the embodiments of the present invention or the technical solution in prior art more clearly, the drawings used in description of the embodiments or prior art will be briefly described below. Obviously, the drawings in the following description illustrate only the embodiments of the present invention, and other drawings can be obtained based on the provided drawings by those of ordinary skill in the art without any creative effort.

Figure 1:
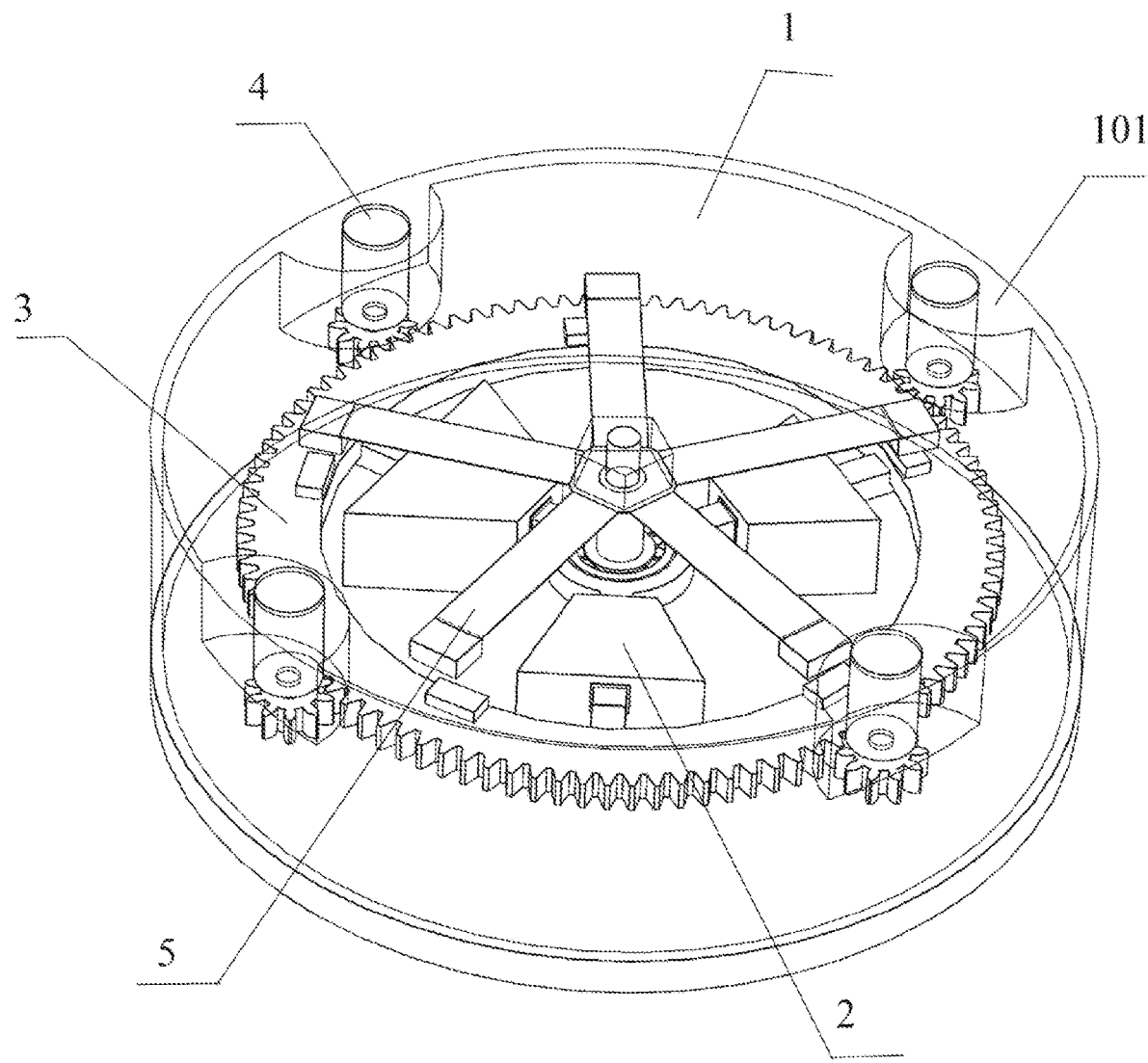
FIG. 1 is a schematic view of the overall structure of an apparatus according to a particular embodiment of the present invention.
Figure 2:
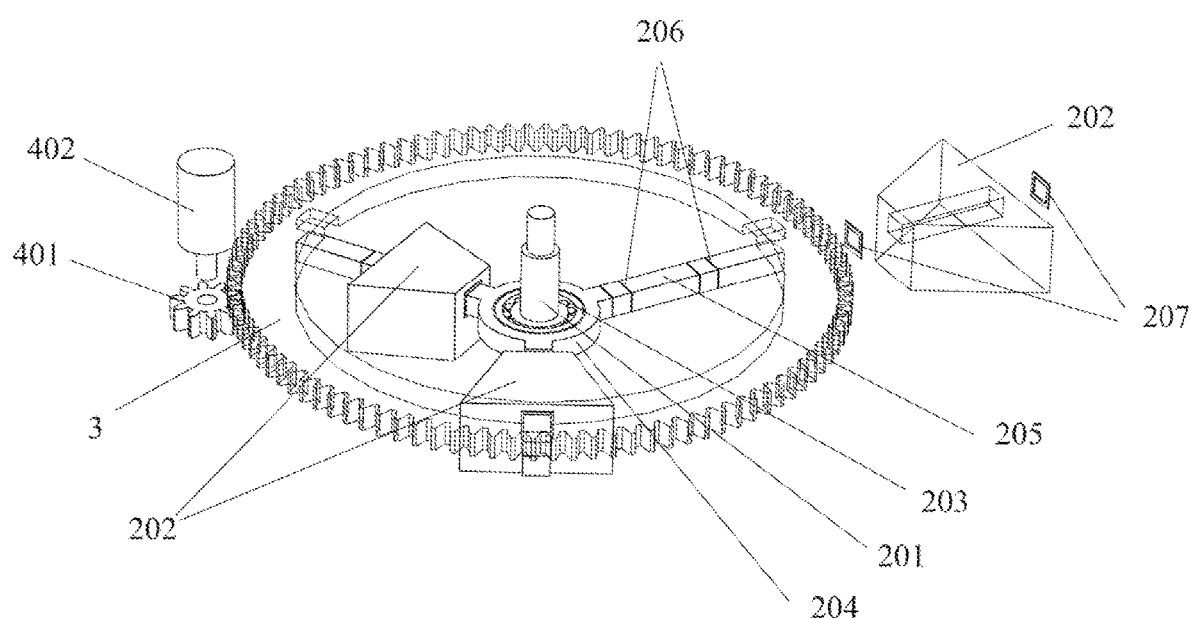
FIG. 2 is a schematic view of the specific structure of the compound-pendulum mechanism and the electromagnetic power generation mechanism shown in FIG. 1.
Figure 3:
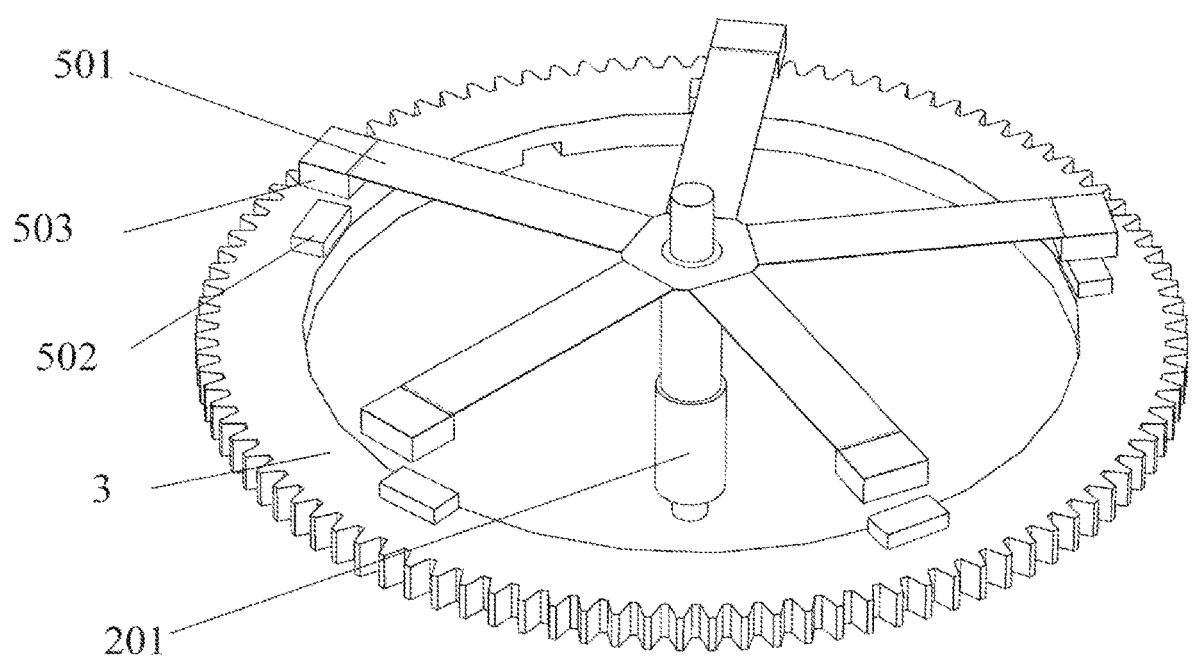
FIG. 3 is a schematic view of the specific structure of the piezoelectric power generation mechanism shown in FIG. 1.

Reference numbers in FIGS. 1 to 3:

1 shell, 2 compound-pendulum mechanism, 3 driving gear, 4 electromagnetic power generation mechanism, 5 piezoelectric power generation mechanism;

101 mounting groove, 201 support shaft, 202 swing block, 203 bearing, 204 rotating disk, 205 rotating beam, 206 clamping groove, 207 baffle, 401 driven gear, 402 rotor generator, 501 piezoelectric power generation beam, 502 excitation magnet, 503 response magnet.

DETAILED DESCRIPTION OF THE PREFERRED EMBODIMENTS

The technical solution in the embodiments of the present invention will be described clearly and completely with reference to the drawings in the embodiments of the present invention. Obviously, described are merely some embodiments of the present invention and not all of them. Any other embodiment obtained by those of ordinary skill in the art without creative effort based on the embodiments of the present invention shall fall within the scope of protection of the present invention.

Referring to FIG. 1, the FIG. 1 is a schematic view of the overall structure of an apparatus according to a particular embodiment of the present invention.

In a particular embodiment of the present invention, the compound-pendulum up-conversion wave energy harvesting apparatus mainly includes a shell 1, a compound-pendulum mechanism 2, a driving gear 3, an electromagnetic power generation mechanism 4 and a piezoelectric power generation mechanism 5.

The shell 1 is the main structure of the apparatus and is used mainly for mounting and bearing other parts. When in use, the shell 1 floats on the water surface and swings un-directionally with fluctuation of waves on the water surface. Generally, the shell 1 is mainly of a cylindrical shape which can adapt well to wave impacts from different directions on the water surface. Of course, the shell 1 can also be of a square-cylindrical shape or the like. Besides, the center of gravity of the shell 1 can be situated in its lower portion, so as to prevent it from being submerged or falling under the water surface under the impact of waves. In addition, in order to prolong the service life, the outer surface of the casing 1 can be sprayed with a hydrophobic layer or anticorrosive layer. In order to facilitate the disassembly and assembly of the shell 1 as well as the adjustment, maintenance or replacement of the compound-pendulum mechanism 2 and other internal components during subsequent uses, in this embodiment, the shell 1 has a detachable structure, including an upper shell 1 and a lower shell 1 which are snap-fitted to each other.

The compound-pendulum mechanism 2 is arranged in the shell 1 and can freely rotate in the shell 1. When the shell 1 swings, it will drive the compound-pendulum mechanism 2 to rotate or swing. The compound-pendulum mechanism 2 is complex swinging mechanism that includes a main pendulum and a plurality of auxiliary pendulums. When the shell 1 swings, it can easily generate deflection torque and then swing or rotate under the influence of gravity or inertia or other factors, and serves as the energy capture mechanism of the present apparatus. Due to the uncertainty of water surface waves, the key parameters such as the direction, amplitude and frequency of wave impact are different and in dynamic change. Therefore, the rotation of the compound-pendulum mechanism 2 caused by wave impact is also un-directional, and its rotating motion parameters, such as rotation direction, rotation speed and rotation axis, are constantly changing, all in accordance with the change of wave impact.

The driving gear 3 is arranged in the shell 1 and rotates synchronously with the compound-pendulum mechanism 2, or it can be considered that the compound-pendulum mechanism 2 drives the driving gear 3 to rotate. In the whole power transmission chain, at the front end of the driving gear 3 are the shell 1 and the compound-pendulum mechanism 2, which serve as the power input mechanism that inputs wave energy, and the driving gear 3 is in the intermediate portion and provides power connection and transmission, and at the rear end are the electromagnetic power generation mechanism 4 and the piezoelectric power generation mechanism 5, which serve as the power output mechanism that outputs electric energy.

The electromagnetic power generation mechanism 4 is arranged in the shell 1 and is mainly configured to be meshed with the driving gear 3 for transmission, so as to generate electricity through rotation by using the electromagnetic induction principle under the driving of the driving gear 3. The piezoelectric power generation mechanism 5 is arranged in the shell 1 and specifically above the end face of the driving gear 3, and is mainly configured to be elastically deformed during rotation of the driving gear 3 through the interaction force therebetween, while generating electricity by using the electric energy generated through the piezoelectric effect of the piezoelectric material.

In this way, when the shell 1 swings un-directionally on the water surface with fluctuation of the wave, the compound-pendulum mechanism 2 in the shell 1 generates deflection torque under the influence of gravity, inertia and other factors, and then makes non-directional rotation accordingly. The rotation state parameters (such as steering, angular velocity) of the compound-pendulum mechanism 2 are closely related to the characteristics of water surface wave energy, such as frequency, direction, amplitude. Therefore, the rotating motion of the compound-pendulum mechanism 2 can adapt well to the dynamic changes of water surface wave energy, providing high energy capture efficiency. Meanwhile, once the compound-pendulum mechanism 2 drives the driving gear 3 to rotate synchronously, the electromagnetic power generation mechanism 4 and the piezoelectric power generation mechanism 5 can simultaneously convert their mechanical energy through two different electromechanical coupling transduction mechanisms, providing wide coverage of wave energy spectrums, good adaptability and high energy conversion efficiency.

It should be noted that the water surface in this embodiment not only refers to the ocean surface, but also includes water surfaces such as lake surface and river surface.

Referring to FIG. 2, the FIG. 2 is a schematic view of the specific structure of the compound-pendulum mechanism and electromagnetic power generation mechanism shown in FIG. 1.

In a preferred embodiment of the compound-pendulum mechanism 2, the compound-pendulum mechanism 2 mainly includes a support shaft 201, a swing block 202, a bearing 203, a rotating disk 204, a rotating beam 205, a clamping groove 206 and a baffle 207.

The support shaft 201 may be vertically arranged in the shell 1, with its top end connected to the inner cavity of the upper half of the shell 1 and its bottom end connected to the inner cavity of the lower half of the shell 1. The connection therebetween is generally interference connection to prevent the support shaft 201 from rotating or shaking. The bearing 203 is sleeved on the support shaft 201 possibly at the middle shoulder position of the support shaft 201 (the top shoulder position being used for mounting the piezoelectric power generation mechanism 5). The rotating disk 204 is mounted on the outer ring of the bearing 203 and can rotate synchronously with its outer ring around the inner ring and the support shaft 201 under the action of the bearing 203. The rotating beams 205 are connected in the circumferential direction of the rotating disk 204. Generally, a plurality of beams, e.g., 3 to 6 beams, can be arranged and distributed uniformly in the circumferential direction of the rotating disk 204.

The swing block 202 is mounted on the rotating beam 205 and can slide on the rotating beam 205 in its axial direction. Specifically, the swing block 202 may be provided with a through hole therein, so that the rotating beam 205 can conveniently passes through the swing block 202. Because of the large mass of the swing block 202, the position of the center of gravity of the compound-pendulum mechanism 2 mainly depends on the position of the swing block 202. The position of the center of gravity of the compound-pendulum mechanism 2 can be conveniently adjusted by adjusting the sliding position of each swing block 202 respectively on each rotating beam 205. Meanwhile, in order to drive the driving gear 3 to rotate synchronously, the ends of each of the rotating beams 205 are connected to the inner circular surface of the driving gear 3. As such, this is equivalent to arrangement of the compound-pendulum mechanism 2 in the inner ring of the driving gear 3. When impacted by waves, each swing block 202 drives each rotating beam 205 and rotating disk 204 to rotate around the support shaft 201, while driving the driving gear 3 to rotate.

Preferably, considering the randomness of wave impact parameters, the center of gravity of the compound-pendulum mechanism 2 needs to deviate from the geometric center in order to conveniently produce nonlinear swinging with multiple degrees of freedom. Therefore, in this embodiment, the swing blocks 202 have different masses and are mounted at different positions on the rotating beams 205. For example, three rotating beams 205 may be arranged uniformly in the circumferential direction of the rotating disk 204, and one swing block 202 is mounted on each rotating beam 205. One of the swing blocks 202 has a large volume and mass and serves as the main pendulum, while the other two swing blocks 202 have a small volume and mass and serve as the auxiliary pendulums. In this way, the center of gravity of the compound-pendulum mechanism 2 of this structure deviates toward the position of the main pendulum, so that when impacted by waves, it can easily generate gravity deflection toque and inertia torque. In addition to changing the center of gravity of the compound-pendulum mechanism 2, the inherent frequency of the compound-pendulum mechanism 2 can be adjusted by adjusting the number and masses of the swing blocks 202, so as to adapt to wave energy at different frequencies. In order to comply with the swinging motion of the compound-pendulum mechanism 2, the swing blocks 202 may specifically have a fan shape or a conical shape, and of course, the swing blocks 202 may also have other shapes.

With this arrangement, as the position of center of gravity of the compound-pendulum mechanism 2 can be adjusted by changing the mass distribution of the swing blocks 202 and their mounting positions on the rotating beams 205, the rotating motion of the compound-pendulum mechanism 2 can be better adapted to the dynamic changes of wave energy on water surfaces in different water areas.

In addition, although the swing blocks 202 can slide on the rotating beams 205 for convenient adjustments to the position of center of gravity (with reference to the annual wave energy change on the water surface), in practical use, the swing blocks 202 need to be stably secured to the rotating beams 205 to prevent motion interference caused by change of the center of gravity at any time. In view of this, in this embodiment, a plurality of clamping grooves 206 are axially opened on each rotating beam 205, and baffles 207 are used in cooperation with the clamping grooves 206. When a swing block 202 needs to be secured, two baffles 207 can be inserted respectively into the corresponding clamping grooves 206 at the front and rear end faces of the swing block 202 to secure this swing block 202 to the rotating beam 205 to prevent it from sliding back and forth.

In a preferred embodiment of the electromagnetic power generation mechanism 4, the electromagnetic power generation mechanism 4 mainly includes a driven gear 401 and a rotor generator 402.

A plurality of driven gears 401 are arranged and distributed in the circumferential direction of the driving gear 3 and meshed with the driving gear 3 at the same time. The rotating shaft of the rotor generator is connected to the rotating shaft of the driven gear 401. When the driving gear 3 is driven by the compound-pendulum mechanism 2 to rotate, the driving gear 3 is meshed with the driven gear 401 to drive the rotating shaft of the rotor generator 402 to rotate, thereby generating induced electromotive force through the relative movement between the rotor and the stator in the rotor generator 402, and consequently generating an induced current, achieving the conversion from mechanical energy to electrical energy.

Specifically, two to eight driven gears 401 can be provided and uniformly distributed on the inner wall of the shell 1. In order to mount the driven gears 401 and rotor generators 402 stably, in this embodiment, a plurality of mounting grooves 101 are opened on the inner wall of the shell 1, and the groups of driven gear 401 and rotor generator 402 are mounted through the mounting grooves 101.

Also, in order to ensure the power generation efficiency, the transmission ratio between the driving gear 3 and the driven gear 401 needs to be greater than 1, such as 12 to 28, so that the power transmission from the driving gear 3 to the driven gear 401 produces accelerated transmission, thereby increasing the rotor rotation speed of the rotor generator 402. It can be seen that, due to the acceleration ratio between the driving gear 3 and the driven gear 401, the electromagnetic power generation mechanism 4 in this embodiment can be adapted to low-frequency wave energy.

Referring to FIG. 3, the FIG. 3 is a schematic view of the specific structure of the piezoelectric power generation mechanism shown in FIG. 1.

In a preferred embodiment of the piezoelectric power generation mechanism 5, the piezoelectric power generation mechanism 5 mainly includes a piezoelectric power generation beam 501, an excitation magnet 502 and a response magnet 503. A plurality of piezoelectric power generation beams 501 are generally provided and each connected to the support shaft 201 of the compound-pendulum mechanism 2. Of course, the piezoelectric power generation beams 501 may each be connected to the top end of the support shafts 201 in order to avoid motion interference. The piezoelectric power generation beams 501 may specifically be made of piezoelectric ceramic, etc., and when it is deformed by an external force, polarization occurs inside it, and opposite charges appear on its two opposite surfaces, thereby generating current.

In order to ensure that the piezoelectric power generation beams 501 can be smoothly driven to be deformed during rotation of the driving gear 3, in this embodiment, the excitation magnet 502 and the response magnet 503 constitute a force transmission assembly, which can generate corresponding acting force on the piezoelectric power generation beams 501 during rotation of the driving gear 3. At the same time, the piezoelectric power generation beams 501 can be vertically turned over or vertically swung on the support shaft 201. Specifically, the excitation magnet 502 is arranged on the end face of the driving gear 3. A plurality of excitation magnets 502 may be provided and uniformly distributed in the circumferential direction of the end face of the driving gear 3. The response magnet 503 is arranged at the end of each piezoelectric power generation beam 501 and generates magnetic force together with each excitation magnet 502. In addition, the excitation magnet 502 and the response magnet 503 face directly each other, and their surfaces facing directly each other have the same polarity, so that a repulsive force is generated.

In this way, with the rotation of the driving gear 3, each excitation magnet 502 arranged on its end face constantly faces directly the response magnet 503 on each piezoelectric power generation beam 501, generating a repulsive force to lift the piezoelectric power generation beam 501 upwards, so that the piezoelectric power generation beam 501 is vertically turned over and then deformed, finally generating current through the piezoelectric effect. In addition, during the waiting interval after the repulsive force is generated between two adjacent excitation magnets 502 and the response magnet 503 in between, the corresponding piezoelectric power generation beam 501 will be turned over back under the action of gravity and return to the initial state, and then turned over upward again under the repulsive force, thereby producing reciprocating vertical vibration. The larger the number of excitation magnets 502, the higher the vibration frequency of the piezoelectric power generation beam 501 and the higher the power generation efficiency. Meanwhile, the inherent frequency of the piezoelectric power generation beam 501 is generally higher than the frequency of ocean waves. When the piezoelectric power generation beam 501 is excited by the excitation magnet 502, it oscillates at its own inherent frequency, to convert the low-frequency vibration of the ocean wave into the high-frequency vibration of the piezoelectric power generation beam 501, thereby achieving frequency-up-converted vibration. It can be seen that, due to the up-conversion mechanism between the driving gear 3 and the piezoelectric power generation beam 501, the piezoelectric power generation mechanism 5 in this embodiment can adapt to high-frequency wave energy.

The above description of the disclosed embodiments enables those skilled in the art to implement or employ the invention. Numerous modifications to these embodiments will be apparent to those skilled in the art, and the general principles defined herein can be implemented in other embodiments without departing from the spirit or scope of the present invention. Therefore, the present invention shall not be limited to the embodiments illustrated herein, but shall be accorded with the widest scope consistent with the principles and novel features disclosed herein.

What is claimed is:

1. A compound-pendulum up-conversion wave energy harvesting apparatus, comprising:
    a shell (1) comprising a top surface and a bottom surface, the shell floating on a water surface and swinging with fluctuation of waves, the bottom surface of the shell in contact with the water surface;
    a compound-pendulum mechanism (2) rotatably arranged in the shell (1) and rotating with swinging of the shell;
    a driving gear (3) rotatably arranged in the shell (1) above the bottom surface of the shell, the driving gear (3) rotating synchronously with the compound-pendulum mechanism (2);
    an electromagnetic power generation mechanism (4) arranged in the shell (1) and configured to be meshed with the driving gear (3) for transmission and driven by the driving gear to generate electricity through electromagnetic induction; and
    a piezoelectric power generation mechanism (5) rotatably arranged in the shell (1) above a top face of the driving gear (3), the piezoelectric power generation mechanism (5) configured to be deformed during rotation of the driving gear (3) to generate electricity through piezoelectric effect;
    wherein the compound-pendulum mechanism (2) comprises a support shaft (201) vertically arranged on a bottom face of the shell (1) and a plurality of swing blocks (202) circumferentially rotatably connected to a side face of the support shaft (201), an inner circular surface of the driving gear (3) being connected to an outer end face of each of the swing blocks (202); and
    wherein the piezoelectric power generation mechanism (5) comprises a plurality of piezoelectric power generation beams (501) that are vertically swingably connected to a circumferential side face of the support shaft (201) and configured to generate electricity through swinging and deformation, and a force transmission assembly configured to drive the piezoelectric power generation beams (501) to vertically swing during rotation of the driving gear (3).

2. The compound-pendulum up-conversion wave energy harvesting apparatus of claim 1, wherein the compound-pendulum mechanism (2) further comprises
    a bearing (203) sleeved on the support shaft (201),
    a rotating disk (204) mounted on an outer circular surface of the bearing (203), and
    a plurality of rotating beams (205) connected to an outer circular surface of the rotating disk (204) and distributed in a circumferential direction around the outer circular surface of the rotating disk (204),
    the swing blocks (202) being respectively mounted on the rotating beams (205), with one end of each rotating beam (205) being connected to the inner circular surface of the driving gear (3).

3. The compound-pendulum up-conversion wave energy harvesting apparatus of claim 2, wherein the swing blocks (202) are each axially slidably arranged on a corresponding one of the rotating beams (205), and a plurality of clamping grooves (206) are axially opened on each of the rotating beams (205), each of the clamping grooves (206) on a rotating beam (205) being configured for mounting a baffle (207) for securing the respective swing block (202) at a current position.

4. The compound-pendulum up-conversion wave energy harvesting apparatus of claim 3, wherein the swing blocks (202) are each formed as a conical block, a spherical block or a square-shaped block, and masses of the swing blocks (202) are different from each other.

5. The compound-pendulum up-conversion wave energy harvesting apparatus of claim 1, wherein the electromagnetic power generation mechanism (4) comprises a plurality of driven gears (401) rotatably arranged in the shell (1) and meshed with the driving gear (3), and a plurality of rotor generators (402) mounted in the shell (1) and connected to rotating shafts of the driven gears (401) for generating electricity through rotation.

6. The compound-pendulum up-conversion wave energy harvesting apparatus of claim 5, wherein the driven gears (401) are distributed uniformly in a circumferential direction of the driving gear (3), and a transmission ratio between the driving gear (3) and each of the driven gears (401) is an acceleration ratio.

7. The compound-pendulum up-conversion wave energy harvesting apparatus of claim 6, wherein a plurality of mounting grooves (101) are formed on an inner wall of the shell (1) for mounting the rotor generators (402) and the driven gears (401).

8. The compound-pendulum up-conversion wave energy harvesting apparatus of claim 1, wherein the force transmission assembly comprises
   a plurality of excitation magnets (502) arranged on the face of the driving gear (3) in a circumferential direction around the driving gear (3) and
   a plurality of response magnets (503) arranged on respective ends of the piezoelectric power generation beams (501) and facing directly the excitation magnets (502),
   wherein a repulsive force is maintained between the excitation magnets (502) and the response magnets (503).

* * * * *